(12) United States Patent
Morales et al.

(10) Patent No.: US 6,496,384 B1
(45) Date of Patent: Dec. 17, 2002

(54) CIRCUIT BOARD ASSEMBLY AND METHOD OF FABRICATING SAME

(75) Inventors: Jorge Morales, Chihuahua (MX); Cesar Avitia, Chihuahua (MX)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/957,782

(22) Filed: Sep. 21, 2001

(51) Int. Cl.7 ................................................. H05K 3/36
(52) U.S. Cl. ........................ 361/784; 361/803; 439/65; 29/830; 29/840
(58) Field of Search ................................. 361/767, 768, 361/784, 788, 790, 803; 257/685, 686, 723, 724, 730; 439/65; 29/830, 831, 840; 438/109

(56) References Cited

U.S. PATENT DOCUMENTS

| | | | |
|---|---|---|---|
| 5,455,742 A | * 10/1995 | Phoy et al. | 361/784 |
| 5,484,965 A | * 1/1996 | Woychik | 439/65 |
| 5,629,839 A | 5/1997 | Woychik | 361/803 |
| 5,644,475 A | 7/1997 | Woychik et al. | 361/767 |
| 5,754,411 A | 5/1998 | Woychik | 361/803 |
| 5,907,475 A | 5/1999 | Babinski et al. | 439/65 |
| 6,128,201 A | 10/2000 | Brown et al. | 361/784 |

* cited by examiner

Primary Examiner—Kamand Cuneo
Assistant Examiner—John B. Vigushin
(74) Attorney, Agent, or Firm—Brinks Hofer Gilson & Lione

(57) ABSTRACT

A circuit board assembly and method of fabricating an assembly are provided. The assembly preferably comprises a first circuit board defining an aperture and a second circuit board having an edge. The first circuit board has at least one conductive feature proximate the aperture, and the second circuit board has at least one conductive feature proximate the edge. Each board has at least one circuit trace in electrical communication with its respective conductive feature. The conductive features of the boards are placed in electrical communication with each other by way of the edge of the second board being disposed in the aperture of the first board. A solder joint can be disposed on the assembly so as to connect the first and second boards.

21 Claims, 2 Drawing Sheets

CIRCUIT BOARD ASSEMBLY AND METHOD OF FABRICATING SAME

FIELD OF THE INVENTION

The present invention relates to circuit board assemblies comprising a main or motherboard and a satellite or daughter board. More particularly, the present invention relates to a circuit board assembly in which an aperture in the main board receives the satellite board, and a hole in the satellite board provides a surface for a solder joint that connects the two boards.

BACKGROUND OF THE INVENTION

Many electrical applications contain circuit board assemblies in which one circuit board is connected to one or more additional boards. A main board, commonly referred to as a motherboard, can have several satellite or daughter boards connected to it. Typically, the satellite boards are mounted to the main board in a perpendicular arrangement in order to maximize the number of satellite boards that can be connected to the main board.

The connection between the main and satellite boards can be accomplished in a variety of manners. In conventional circuit board assemblies, various modular connectors frequently facilitate the connection. For example, main boards can have modular connectors disposed on their surface. The connector is typically an extra component that is secured to the main board and defines a slot having conductive features that communicate with conductive features on an edge of the satellite board. The assembly is fabricating by pushing the edge of the satellite board into the connector, thereby establishing electrical communication between the two boards.

While the use of modular connectors allows for easy connection between main and satellite boards, they also add expense and difficulty to the manufacturing process. The connectors are frequently plastic components that must be separately manufactured and attached to the main board. Furthermore, the connectors are bulky, making the final main board more difficult to handle, package, and transport.

Alternatives to the modular connectors have been proposed. For example, U.S. Pat. No. 5,484,965 to Woychik for a CIRCUIT BOARD ADAPTED TO RECEIVE A SINGLE IN-LINE PACKAGE MODULE discloses a main board that has an aperture adapted to receive a satellite board. While this arrangement does allow for the elimination of the modular connectors, it does not retain some of the benefits of the connectors. For example, the modular connectors provided a stable connection between the two boards.

SUMMARY OF THE INVENTION

The present invention provides a circuit board assembly that defines structural features that allow for improved stability in the connection between two boards.

In one embodiment, the assembly comprises a first circuit board defining an aperture and a second circuit board having an edge. The first circuit board has at least one conductive feature proximate the aperture, and the second circuit board has at least one conductive feature proximate the edge. Each board has at least one circuit trace in electrical communication with its respective conductive feature. The conductive features of the boards are placed in electrical communication with each other by way of the edge of the second board being disposed in the aperture of the first board. This relationship places the circuit traces of the first board in electrical communication with the circuit traces of the second board.

The second board defines a hole proximate the edge. Preferably, the hole extends through the entire thickness of the second board, i.e., from a first side to a second side.

When the edge of the second board is disposed in the aperture of the first board, the hole is positioned near a surface of the main board. As such, the hole is particularly well-suited for receiving a portion of a. solder joint. In a preferred embodiment, the assembly further comprises a solder joint connecting the two boards. Preferably, the solder joint includes a first portion disposed in the hole and second and this portions disposed on the first board. A fourth portion of the solder joint can be disposed within a void region defined by the first board proximate the aperture.

The present invention also provides a method of fabricating a circuit board assembly. In a preferred embodiment, the method comprises providing a first circuit board; creating an aperture in the first circuit board; disposing a first conductive feature on the first circuit board proximate the aperture; providing a second circuit board having an edge, a second conductive feature proximate the edge, and defining a hole proximate the edge; disposing the edge of the second circuit board within the aperture of the first circuit board such that the conductive features of the two boards are in electrical communication with each other; and disposing a solder joint on the first and second circuit boards. Preferably, the hole is a through hole, and the solder joint comprises a first portion disposed on the first circuit board proximate the aperture, a second portion disposed within the hole, and a third portion disposed on the first circuit board proximate the aperture.

DETAILED DESCRIPTION OF THE INVENTION

The following description of preferred embodiments of the invention provides examples of the present invention. The embodiments discussed herein are merely exemplary in nature, and are not intended to limit the scope of the invention in any manner. Rather, the description of these preferred embodiments serves to enable a person of ordinary skill in the relevant art to make and use the present invention.

Figure 1:
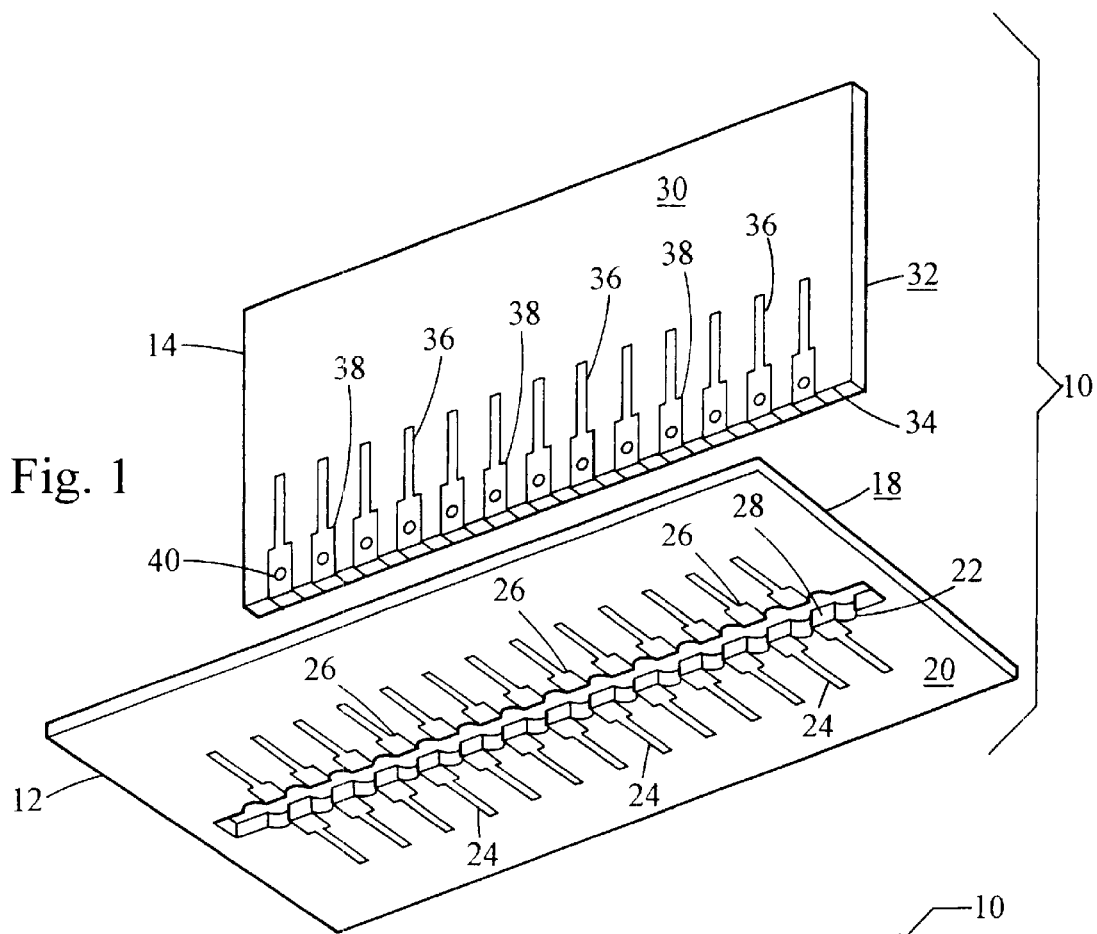
FIG. 1 is an exploded view of a circuit board assembly according to the present invention.
Figure 3:
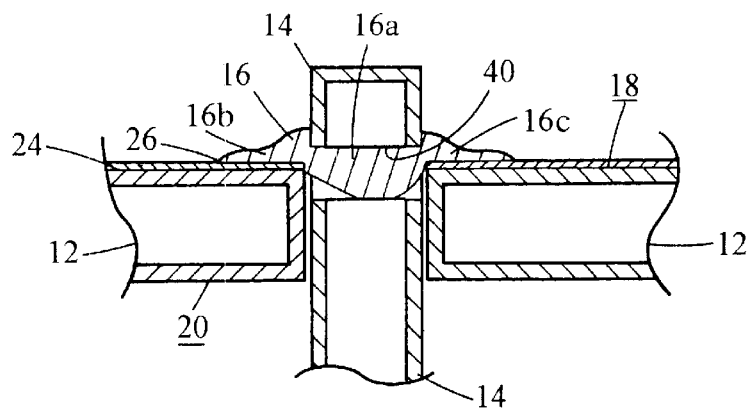
FIG. 3 is a cross-sectional view, taken along line 3—3 in FIG. 2.

FIG. 1 illustrates a circuit board assembly 10 in accordance with a first preferred embodiment of the present invention. The assembly comprises a first circuit board 12 and a second circuit board 14. The first circuit board 12 can be considered a main or motherboard, and the second circuit board 14 can be considered a daughter or satellite board. It will be readily understood, however, that the features of the invention, as described herein, have been assigned to respective boards in an arbitrary manner, and that each board can be either a main board or a satellite board. Furthermore, the assembly 10 can comprise a plurality of second circuit boards 14, all identical, similar, or unique, attached to the first board 12. As best illustrated in FIG. 3, the assembly preferably further comprises a solder joint 16 connecting the two boards 12, 14.

Figure 2:
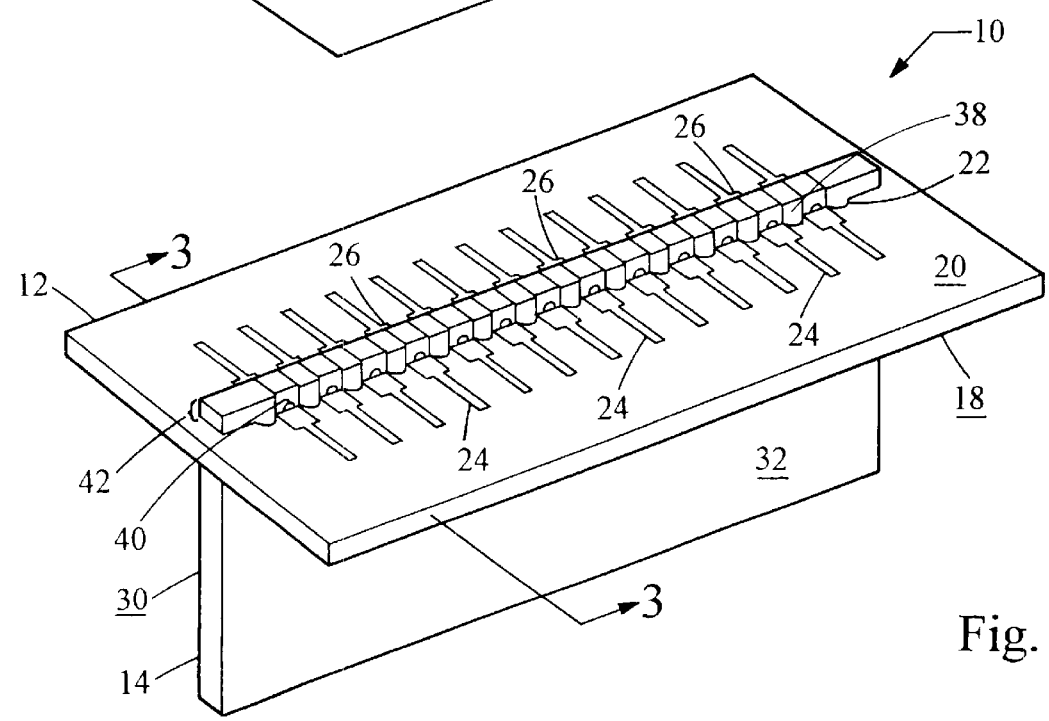
FIG. 2 is a bottom view of a circuit board assembly according to the present invention.

As best illustrated in FIGS. 1 and 2, the first circuit board 12 has top 18 and bottom 20 surfaces and defines an aperture 22. At least one circuit trace 24 is disposed on one of the surfaces 18,20. Also, the circuit trace 24 terminates in an electrically conductive feature 26.

The aperture 22 comprises a recess in one of the surfaces 18,20 of the first board 12. As such, the aperture has an inner wall 28 around its perimeter. Preferably, the aperture 22 extends from the top surface 18 to the bottom surface 20 of the board 12, i.e., through the thickness of the board 12. As will be developed more fully below, the aperture 22 preferably is of a size that allows it to receive an edge of the second circuit board 14 in a manner that establishes electrical communication between conductive features of the two boards 12,14.

The conductive feature(s) 26 preferably comprise electrically conductive pads disposed on one of the surfaces 18,20 of the board 12. Also preferable, the conductive feature 26 extends along the inner wall 28 of the aperture 22. This positioning facilitates engagement of the conductive features of the second circuit board 14, as will be developed more fully below. The circuit traces 24 and conductive features 26 can be disposed on one side of the aperture 22, or both sides of the aperture 22. Preferably, as best illustrated in FIGS. 2 and 3, the traces 24 and conductive features 26 are disposed on both sides of the aperture 22. Particularly preferable, the traces 24 and conductive features 26 are disposed such that pads of conductive features 26 are disposed substantially opposite each other.

The circuit trace(s) 24 can comprise any suitable circuit trace used on circuit boards. The circuit trace(s) 24 terminate in the conductive features 26 proximate the aperture 22. As such, the trace(s) 24 are in electrical communication with the conductive feature(s) 26.

The second circuit board 14 has first 30 and second 32 sides and defines an edge 34. The second board 14, similar to the first board 12, has one or more conductive circuit traces 36 that terminate in electrically conductive features 38. Preferably, the conductive features 38 are disposed proximate the edge 34. The circuit traces 36 and conductive features 38 can be disposed on one of the sides 30,32 or on both sides 30,32. Preferably, the circuit traces 36 and conductive features 38 are disposed on both sides 30,32 such that conductive features 38 are disposed substantially opposite each other.

The second circuit board 14 defines a hole 40. As best illustrated in FIG. 3, the hole 40 is disposed proximate the edge 34. Preferably, the hole 40 comprises a through hole, i.e., a hole that extends through the thickness of the second circuit board 14 (from the first side 30 to the second side 32). Particularly preferable, the through hole 40 comprises an electrically conductive feature, such as a plated through hole, that places electrically conductive features disposed on opposing sides 30,32 of the board 14 in electrical communication with each other.

As best illustrated in FIG. 2, the edge 34 of the second board 14 is disposed in the aperture 22 of the first board. Preferably, the edge 34 is passed completely through the aperture 22 such that a length 42 of the second board 14 extends beyond the bottom surface 20 of the main board 12. Preferably, the length 42 is sufficient in size to place the hole 40 proximate the bottom surface 20. Particularly preferable, the length comprises a length of approximately 2 mm.

As best illustrated in FIG. 2, the conductive features 38 of the second circuit board 14 are placed in electrical communication with the conductive features 26 of the first board 12 by way of the edge 34 being disposed in the aperture 22. As a consequence, the circuit traces 36 of the second circuit board 14 are placed in electrical communication with the circuit traces 24 of the first circuit board 12.

The solder joint 16 comprises soldering material suitable for deposition onto circuit boards. The solder joint 16 contacts both circuit boards 12, 14 and forms a connection between them, adding stability to the assembly 10. For simplicity, the solder joint is not illustrated in FIG. 2. Preferably, as best illustrated in FIG. 3, the solder joint 16 comprises a unitary solder joint that contacts both boards 12, 14. Particularly preferable, the solder joint 16 includes a first portion 16a disposed within the hole 40 of the second board 14, and a second portion 16b disposed on one of the surfaces 18,20 of the first circuit board 12. A third portion 16c can also be disposed on the first circuit board 12. In this embodiment, illustrated in FIG. 3, the solder joint 16 comprises a bridge that starts on the first board 12 proximate the aperture 22, passes through the hole 40 of the second board 14, and ends on the opposing side of the first board 12, again proximate the aperture 22.

Figure 4:
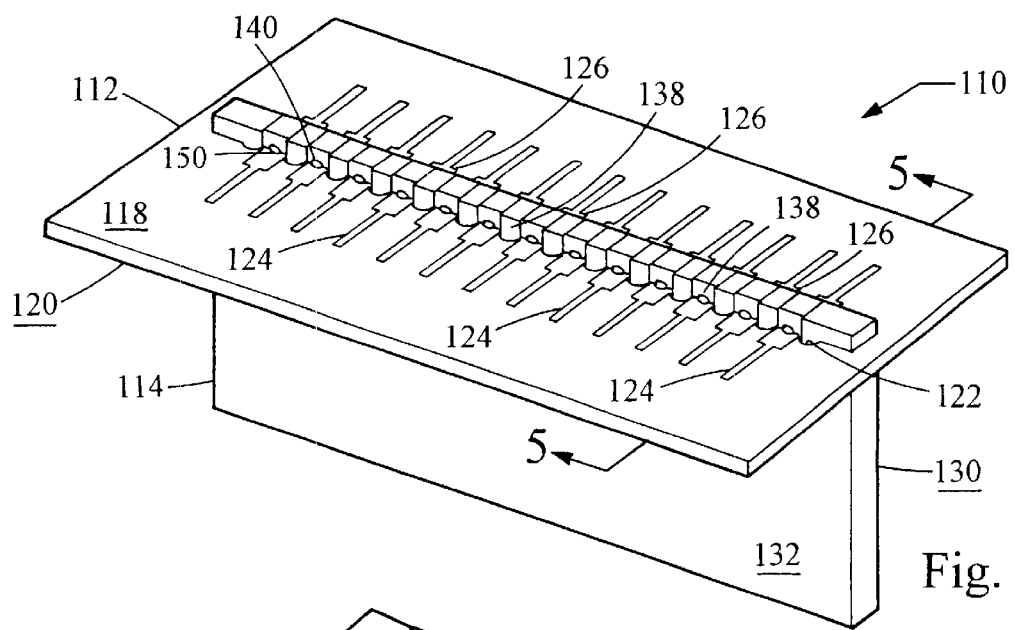
FIG. 4 is a bottom view of a circuit board assembly according to a second preferred embodiment of the present invention.
Figure 5:
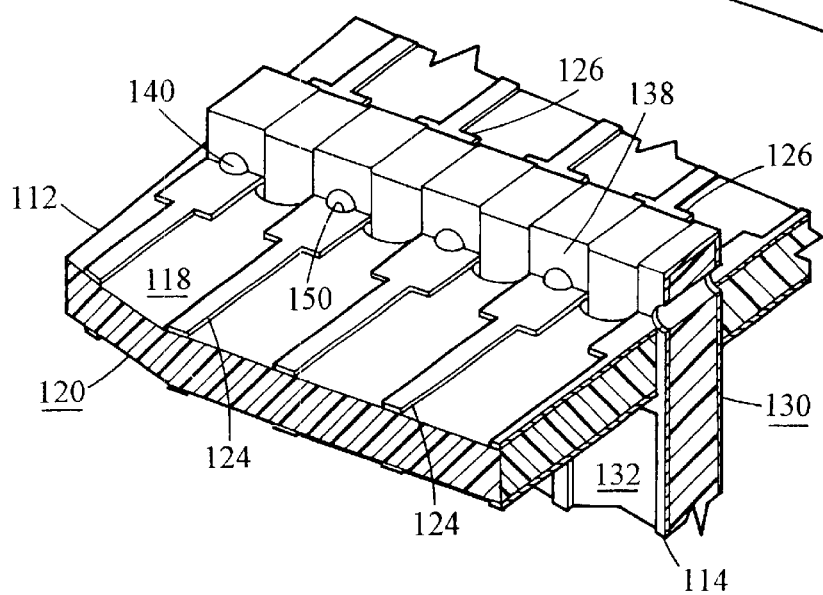
FIG. 5 is a magnified cross-sectional view, taken along line 5—5 in FIG. 4.

FIG. 4 illustrates a second preferred embodiment of the present invention. This embodiment is similar to the first preferred embodiment, except as detailed below. Accordingly, like reference numbers in FIG. 4 refer to similar features and/or components illustrated in the previous figures.

In this embodiment, the first circuit board 112 defines a void region 150 proximate the aperture 122. Preferably, as illustrated in FIG. 4, the void region 150 opens to the aperture 122, and can be viewed as an extension of the aperture 122. Also preferable, the void region 150 is in the shape of a semicircle. Alternatively, any other suitable shape can be used.

The void region 150 is disposed proximate the aperture 122 such that a portion of a solder joint 116 connecting first 112 and second 114 circuit boards can extend down into the void region 150. Accordingly, the void region 150 is preferably disposed adjacent the area on the first board 112 where the solder joint 116 is or will be disposed. Also preferable, the void region 150 extends through the thickness of the first circuit board 112.

In this embodiment, as indicated above, a portion of the solder joint can extend into the void region 150, providing more surface area onto which the solder joint 116 can adhere, thereby making the assembly 110 more stable. Thus, a first portion of the solder joint 116 is disposed within the through hole 140 of the second circuit board 114. Second and third portions of the solder joint 116 are disposed on the first circuit board 112 proximate the aperture 122. A fourth portion of the solder joint 116 is disposed in the void region 150.

The present invention also provides a method of fabricating a circuit board assembly in accordance with the present invention. In a preferred embodiment, the method comprises providing a first circuit board, creating an aperture in the first circuit board, providing a second circuit board having an edge and defining a hole proximate the edge, disposing the edge of the second circuit board in the aperture of the first circuit board, and disposing a solder joint on the first and second circuit boards such that the solder joint connects the first and second circuit boards.

Circuit traces and conductive features can be disposed on the circuit boards either before or after the steps listed above. Preferably, this is done before these steps so as not to interfere with the final assembly process. The placement of conductive features and circuit traces can be accomplished by techniques known in the art. Also, the aperture can be created using conventional techniques, such as drilling, punching, and routing. The aperture is advantageously cleaned of burrs and other artifacts of its creation in order to facilitate disposing the edge of the second circuit board within the aperture.

Preferably, the first and second circuit boards are in accordance with either the first or second preferred embodiment detailed above. Thus, the aperture preferably extends through the thickness of the first circuit board and the hole preferably extends through the thickness of the second circuit board.

The disposing the edge of the second circuit board in the aperture of the first circuit board places the conductive features of the respective boards in electrical communication with each other, which thereby places the circuit traces of the respective boards in electrical communication with each other.

The disposing a solder joint on the first and second circuit boards preferably forms a solder joint in accordance with either the first or second preferred embodiments detailed above. Thus, the solder joint is preferably disposed such that a first portion is within the hole of the second circuit board and second and third portions are disposed on the first circuit board proximate the aperture. Preferably, the hole comprises a through hole and the solder joint comprises the bridge structure detailed above (i.e., the first portion passes through the through hole and the second and third portions are disposed on opposing sides of the aperture on the first circuit board).

Also preferable, the first circuit board further defines one or more void regions proximate the aperture in accordance with the second preferred embodiment detailed above. When such a first circuit board is utilized, the disposing a solder joint on the first and second circuit boards preferably forms a solder joint in accordance with the second preferred embodiment detailed above. That is, the solder joint is preferably disposed such that a first portion is within the hole of the second circuit board and second and third portions are disposed on the first circuit board proximate the aperture. Also, a fourth portion is preferably disposed within the void region.

The foregoing disclosure includes the best mode devised by the inventors for practicing the invention. It is apparent, however, that several variations in accordance with the present invention may be conceivable to one of ordinary skill in the relevant art. Inasmuch as the foregoing disclosure is intended to enable such person to practice the instant invention, it should not be construed to be limited thereby, but should be construed to include such aforementioned variations. As such, the present invention should be limited only by the spirit and scope of the following claims.

We claim:

1. A circuit board assembly comprising:
   a first circuit board defining an aperture and having a first conductive feature proximate the aperture;
   a second circuit board having a first side, a second side, an edge, and a second conductive feature proximate the edge, and defining a hole proximate the edge, the edge being substantially disposed within the aperture of the first circuit board such that the first conductive feature is in electrical communication with the second conductive feature;
   a first circuit trace disposed on the first circuit board and in electrical communication with the first conductive feature; and
   a second circuit trace disposed on the second circuit board and in electrical communication with the second conductive feature and such that the hole is adjacent the first conductive feature.

2. A circuit board assembly in accordance with claim 1, wherein the second circuit board has a third conductive feature proximate the edge.

3. A circuit board assembly in accordance with claim 2, wherein the second conductive feature is disposed on the first side of the second circuit board and wherein the third conductive feature is disposed on the second side of the second circuit board.

4. A circuit board assembly in accordance with claim 3, wherein the second conductive feature is disposed substantially opposite the third conductive feature.

5. A circuit board assembly in accordance with claim 3, wherein the hole comprises a plated through hole providing electrical communication between the second and third conductive features.

6. A circuit board assembly in accordance with claim 1, wherein the first circuit board has a top and bottom surface and wherein the aperture extends from the top surface to the bottom surface.

7. A circuit board assembly in accordance with claim 6, wherein the edge of the second circuit board passes through the aperture such that a length of the second circuit board extends below the bottom surface of the first circuit board.

8. A circuit board assembly in accordance with claim 7, wherein the length comprises a length of approximately 2 mm.

9. A circuit board assembly in accordance with claim 1, further comprising a solder joint connecting the first and second circuit boards.

10. A circuit board assembly in accordance with claim 9, wherein a first portion of the solder joint is disposed within the hole.

11. A circuit board assembly in accordance with claim 10, wherein the solder joint is a unitary joint further comprising second and third portions disposed on the first circuit board proximate the aperture.

12. A circuit board assembly comprising:
    a first circuit board defining an aperture having an inner wall, the first circuit board having top and bottom surfaces and a first conductive feature proximate the aperture and extending along the inner wall;
    a second circuit board having a first side, a second side, an edge, and a second conductive feature proximate the edge, and defining a through hole proximate the edge and extending from the first side to the second side, the edge being substantially disposed within the aperture of the first circuit board such that the first conductive feature is in electrical communication with the second conductive feature;
    a first circuit trace disposed on the first circuit board and in electrical communication with the first conductive trace; and
    a second circuit trace disposed on the second circuit board and in electrical communication with the second conductive feature;

wherein the first circuit trace is in electrical communication with the second circuit trace by way of the edge of the second circuit board being disposed within the aperture of the first circuit board.

13. A circuit board assembly in accordance with claim 12, wherein the second circuit board further comprises a third conductive feature disposed proximate the edge and substantially opposite the second conductive feature.

14. A circuit board assembly in accordance with claim 13, wherein the hole comprises a plated through hole providing electrical communication between the second and third conductive features.

15. A circuit board assembly in accordance with claim 12, wherein the first circuit board defines a void region proximate the aperture.

16. A circuit board assembly in accordance with claim 15, further comprising a solder joint connecting the first and second circuit boards, wherein a first portion of the solder joint is disposed within the through hole.

17. A circuit board assembly in accordance with claim 16, wherein the solder joint further comprises second and third portions disposed on the first circuit board proximate the aperture and a fourth portion disposed in the void region.

18. A method of fabricating a circuit board assembly, comprising:

providing a first circuit board;

creating an aperture in the first circuit board;

disposing a first conductive feature on the first circuit board proximate the aperture;

providing a second circuit board having a first side, a second side, an edge, and a second conductive feature proximate the edge, and defining a hole proximate the edge;

disposing the edge of the second circuit board in the aperture of the first circuit board such that the first conductive feature is in electrical communication with the second conductive feature and such that the hole is adjacent the first conductive feature; and disposing a solder joint on the first and second circuit boards such that the solder joint connects the first and second circuit boards.

19. A method of fabricating a circuit board assembly in accordance with claim 18, wherein disposing a solder joint on the first and second circuit boards comprises disposing a weld joint on the first circuit board proximate the aperture and on the second circuit board within the hole.

20. A method of fabricating a circuit board assembly in accordance with claim 18, wherein the hole comprises a through hole extending from the first side to the second side of the second circuit board, and wherein disposing a solder joint on the first and second circuit boards comprises disposing a first portion of the solder joint within the through hole, and disposing second and third portions of the solder joint on the first circuit board proximate the aperture.

21. A method of fabricating a circuit board assembly in accordance with claim 18, wherein the hole comprises a through hole extending from the first side to the second side of the second circuit board, wherein the first circuit board defines a void region proximate the aperture, and wherein disposing a solder joint on the first and second circuit boards comprises disposing a first portion of the solder joint within the through hole, disposing second and third portions of the solder joint on the first circuit board proximate the aperture, and disposing a fourth portion of the solder joint in the void region.

* * * * *